United States Patent [19]

Isaac et al.

[11] 4,446,476

[45] May 1, 1984

[54] INTEGRATED CIRCUIT HAVING A SUBLAYER ELECTRICAL CONTACT AND FABRICATION THEREOF

[75] Inventors: Randall D. Isaac; Tak H. Ning; Denny D. Tang, all of Yorktown Heights, N.Y.

[73] Assignee: International Business Machines Corporation, Armonk, N.Y.

[21] Appl. No.: 279,119

[22] Filed: Jun. 30, 1981

[51] Int. Cl.$^3$ .................. H01L 23/48; H01L 29/46; H01L 29/62; H01L 27/12

[52] U.S. Cl. .................................. 357/67; 357/68; 357/49; 357/71; 357/48

[58] Field of Search ............. 357/67, 68, 71, 47, 357/65, 49

[56] References Cited

U.S. PATENT DOCUMENTS

| | | | |
|---|---|---|---|
| 3,381,182 | 4/1968 | Thornton | 317/234 |
| 3,653,120 | 4/1972 | Sirrine et al. | 357/59 |
| 3,659,162 | 4/1972 | Toshio et al. | 357/68 |
| 3,908,187 | 9/1975 | Sheldon et al. | 357/67 |
| 4,081,823 | 3/1978 | Cook, Jr. | 357/47 |
| 4,128,670 | 12/1978 | Gaensslen | 427/86 |
| 4,157,269 | 6/1979 | Ning et al. | 148/1.5 |
| 4,234,362 | 11/1980 | Riseman | 148/187 |
| 4,385,433 | 5/1983 | Ozawa | 357/675 |

OTHER PUBLICATIONS

1980 International Electron Devices Meeting (IEDM) Technical Digest, "Self-Aligned NPN Bipolar Transistors", pp. 823-824, Ning et al.

Appl. Phys. Lett. 37(3), Aug. 1, 1980, "Refractory Metal Silicide Formation Induced by AS+ Implantation", pp. 295-298, Tsai et al.

J. Appl. Phys. 50(10), Oct. 1979, "Silicide Formation by High-Dose Si+-ion Implantation of Pd", pp. 6321-6327, Chapman et al.

Primary Examiner—Andrew J. James
Assistant Examiner—John LaMont
Attorney, Agent, or Firm—Pollock, Vande Sande & Priddy

[57] ABSTRACT

An integrated circuit containing a refractory metallic silicide beneath a field isolation region and in electrical contact with electrical conductive regions of active impurity dopants in a semiconductive substrate; and process for the fabrication thereof.

8 Claims, 11 Drawing Figures

FIG.1.1
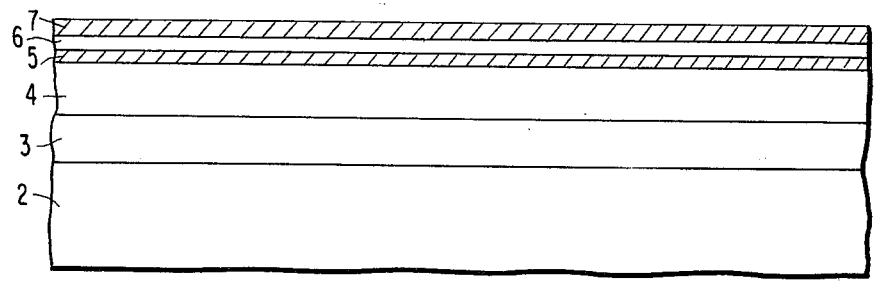
FIG.1.2
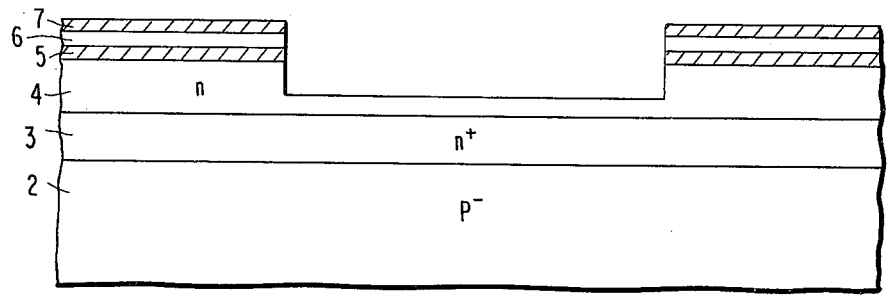
FIG.1.3
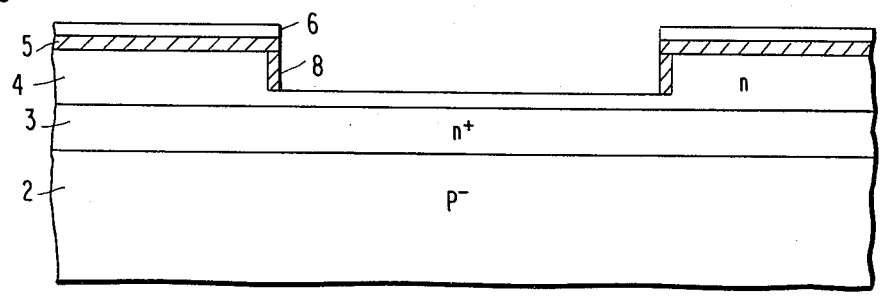
FIG.1.4
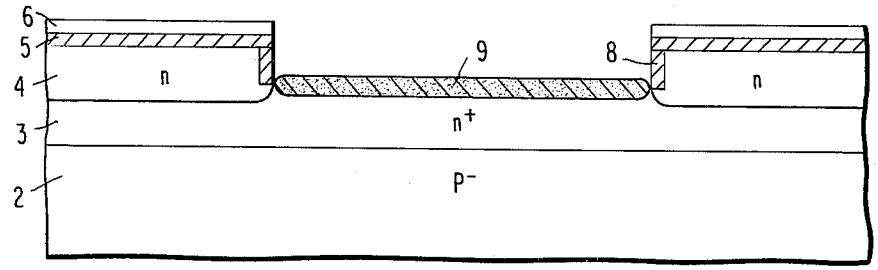

FIG.1.5
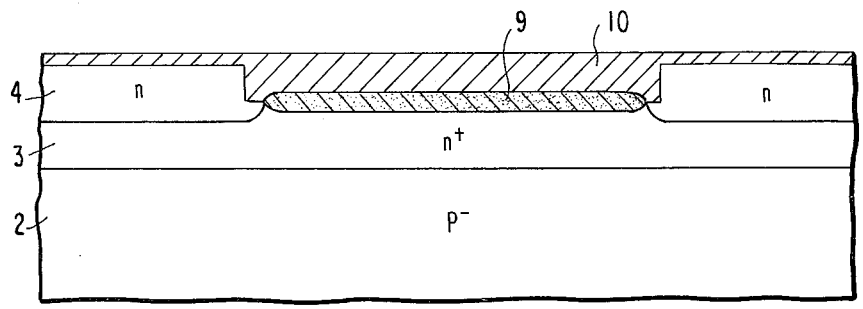
FIG.1.6
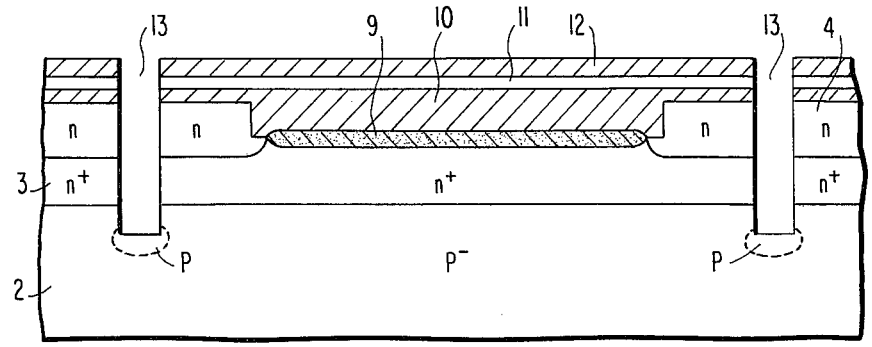
FIG.1.7
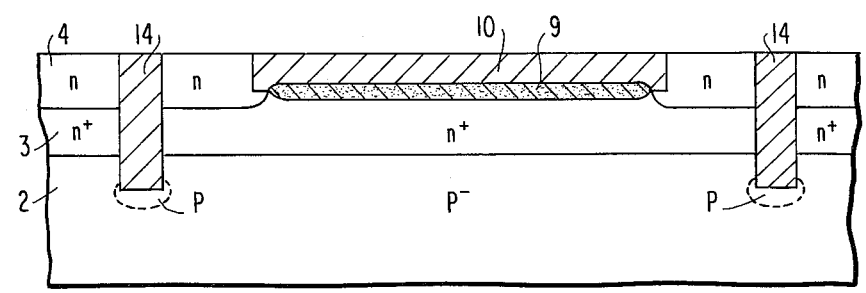
FIG.1.8
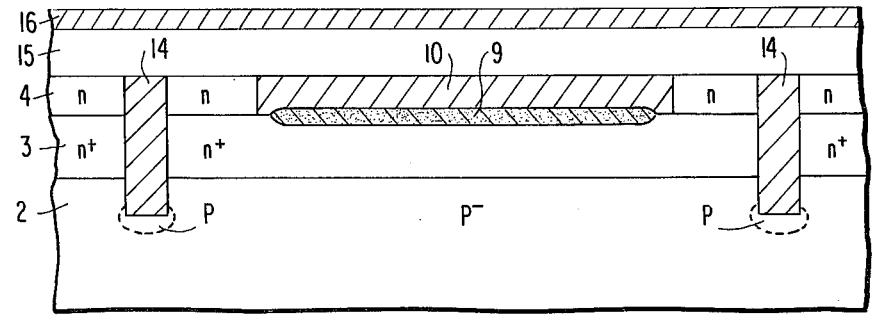

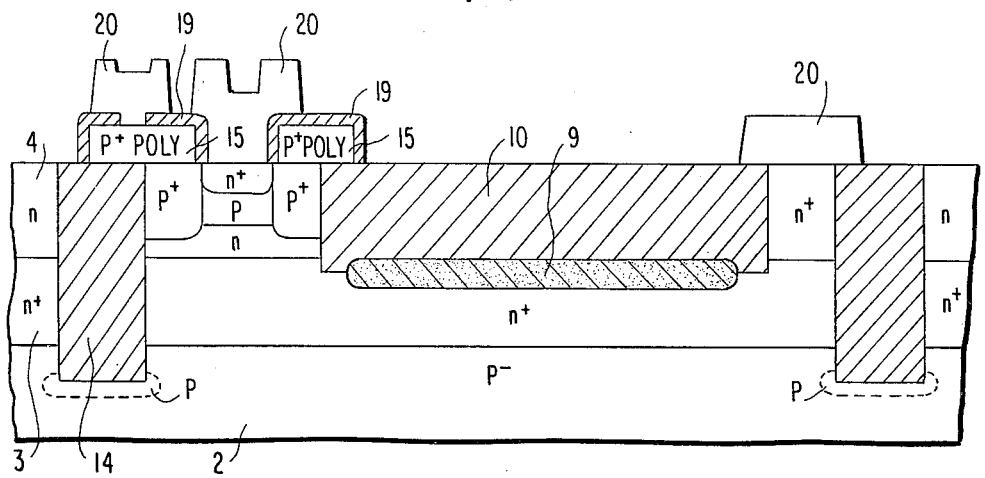
FIG.1.9
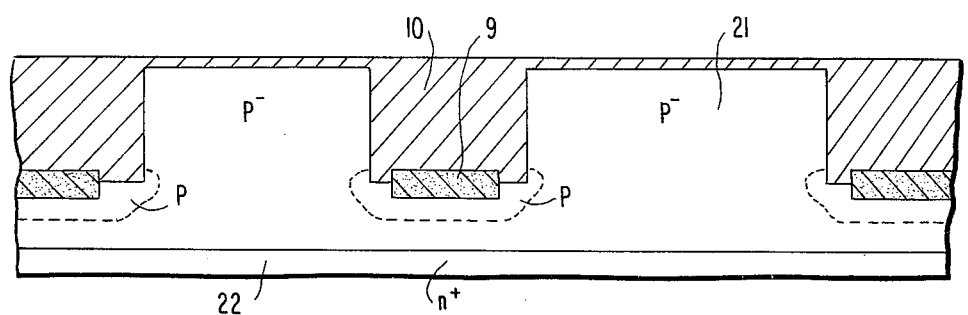
FIG.2.1
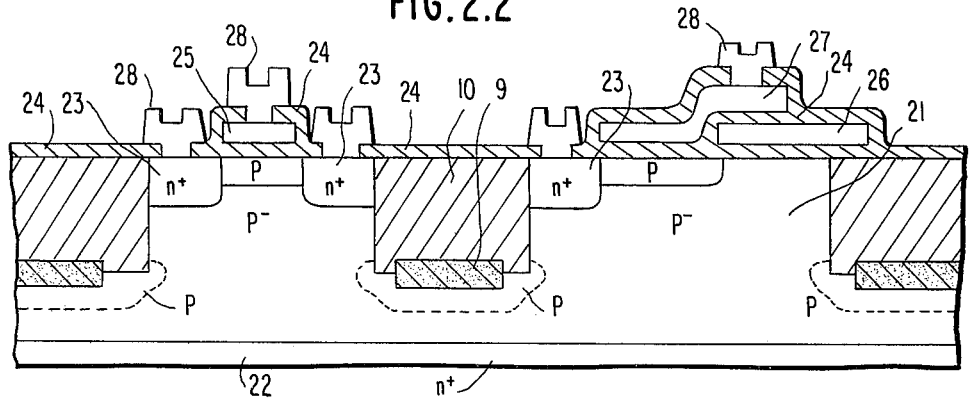
FIG.2.2

INTEGRATED CIRCUIT HAVING A SUBLAYER ELECTRICAL CONTACT AND FABRICATION THEREOF

DESCRIPTION

1. Technical Field

The present invention is concerned with integrated circuits, such as bipolar devices and MOS structures, and with a process for the fabrication thereof. In particular, the present invention is concerned with integrated circuits which contain an electrically conductive layer located beneath an insulating region and in electrical contact with electrical conductive regions of active impurity dopants in the semiconductive substrate. The present invention is also directed to a method for the fabrication of such integrated circuits.

2. Background Art

Integrated circuits contain a plurality of electrical contacts at preselected locations on the device. Also, a predetermined number of the electrical contacts is in ohmic electrical contact with preselected regions of the substrate in order to provide the semiconductive device. The preselected regions include a region which contains ion-implanted or thermally diffused impurities of a second type different from the impurity type of the semiconductor substrate in general.

For instance, when a bipolar device is prepared, the plurality of electrical contacts are the emitter, base, and collector, all of which are in ohmic electrical contact with impurity regions of the device. The emitter and collector are in electrical contact with a first type of impurity, while the base is in ohmic electrical contact with a second type of impurity.

When preparing a MOS device, the plurality of electrical contacts include a source, a drain, and a gate, whereby the source and drain are in electrical contact with a region containing a second type of impurity, and whereas the gate is not in ohmic contact with the substrate.

One particular problem existent in bipolar devices is the resistance in sublayer sheets, such as resistance in the field regions between the emitter and collector contacts. For instance, the sheet resistance in the sublayers is usually at least about 10 ohm/sq. In order to reduce the collector series resistance, heavily doped buried sublayers, usually called subcollector layers, have been used. In addition, in order to avoid large collector series resistance in the design of bipolar circuits, the collector contact is generally located extremely close to the emitter contact. However, this is an important layout constraint in bipolar circuit design.

Moreover, the advent of the self-aligned "Integrated Injection Logic" (IIL), or "Merge Transistor Logic" (MTL), makes it possible to lay out such logic arrays in the Weinberger image. The self-aligned "Integrated Injection Logic", or "Merge Transistor Logic", is very attractive for very large integrated circuit application because of its low power dissipation and high performance. However, the series resistance of the emitter sublayer severely limits the number of wiring channels perpendicular to the gate. One way to attempt to overcome the emitter sublayer series resistance problem is to provide multiple emitter sublayer contacts per gate. This attempted solution, however, adversely affects the circuit density and wirability significantly.

With respect to MOS devices, such as MOSFET and MOS Dynamic RAM structures, the circuits built with them are known to be sensitive to the effect of alpha particles. It is known that if a p-epitaxial substrate on an $n^+$-type wafer is used instead of a p-type wafer, sensitivity to the effect of alpha particles is greatly reduced, since the $n^+$-type wafer is an effective sink for the electrons generated by the alpha particles. However, to be effective, the p-epitaxial substrate has to be thin, as compared to the penetration depth of alpha particles, which is about 25 microns. Such a thin and lightly doped (e.g. typically greater than about 10 ohm-cm) epitaxial layer has a very high sheet resistance which causes transient local fluctuation of the p-type substrate potential. One way to correct for this is to provide a substrate contact to every device or to every few devices. In the conventional contact methods, such a procedure consumes a large amount of the silicon chip area and is, therefore, disadvantageous.

DESCRIPTION OF THE INVENTION

The present invention provides for significantly reduced sublayer sheet resistance in integrated circuits. The present invention also provides for substrate contact to every device in a self-aligned manner without consuming additional substrate chip area. Accordingly, the problem of substrate potential fluctuation discussed hereinabove is overcome by the present invention. Moreover, with respect to bipolar devices, the present invention makes it possible to remotely locate the collector region with respect to the emitter region and, thereby, improve the layout and wirability of the circuit. For instance, in the case of Integrated Injection Logic, or Merged Transistor Logic arrays in the Weinberger image, the greatly reduced emitter sublayer series resistance will allow proportionately more vertical wiring channels to be used without providing multiple emitter sublayer contact per gate. This, in turn, greatly improves the circuit density and wirability thereof.

The present invention is concerned with an integrated circuit which contains a semiconductive substrate having field isolation regions and having electrical conductive regions of active impurity dopants. The device contains a refractory metallic silicide located beneath the field isolation regions and in electrical contact with electrical conductive regions of active impurity dopants in the substrate.

The presence of the silicide layer in the required location of the present invention results in greatly reduced sublayer sheet resistance in those regions where it is present. Also, this reduction in the sublayer sheet resistance makes it possible to reduce the dopant concentration in the sublayer. This reduction in sublayer doping concentration, in turn, can result in reduced defect density associated with the sublayer and in a reduction of the sublayer thickness. The reduction of the sublayer thickness would likewise result in a reduction of the depth of the deep isolation trenches in the circuits.

The process of the present invention is concerned with fabricating the above-defined integrated circuits. Moreover, the preferred process aspects do not require any additional masking steps and yet provide for a self-aligned silicide sublayer. The sublayer is self-aligned with respect to the electrical conductive regions to which it is electrically connected.

The process includes providing a semiconductive substrate of a first conductive type containing active impurities of a first conductive type and then thermally diffusing or ion-implanting active impurities either of the first conductive type or of a second and opposite conductive type into predetermined regions of the semiconductive substrate. Next, a refractory metal is deposited at and in electrical connection with these predetermined regions of the semiconductive substrate. The metal is then reacted with the substrate beneath the metal in order to form a layer of an electrically conductive refractory compound. An insulating layer is then provided above the layer of the electrically conductive refractory compound.

BRIEF DESCRIPTION OF THE DRAWINGS

FIG. 1.1 to 1.9 are schematic side views of a bipolar transistor in various stages of fabrication according to the present invention.

FIG. 2.1 and 2.2 are schematic side views of a MOSFET and a MOS dynamic RAM DEVICE in various stages of fabrication.

BEST AND VARIOUS MODES FOR CARRYING OUT THE INVENTION

It is understood that when the discussion of the fabrication steps refers to an n-type substrate and p-type diffused or implanted dopant impurities, p-type substrate and n-type impurities can be employed just as well. It is understood that when the discussion refers to n-type impurities, the process steps are applicable to p-type impurities and vice versa. Also, the present invention is applicable to substrates other than silicon which are known in the art. Moreover, as used herein, the terms "metallic type interconnection lines" or "high-conductivity interconnection lines" refer to metal lines such as aluminum, as well as to nonmetallic materials (e.g. higly doped polysilicon or intermetallic silicides) which, nevertheless, can have conductivities of the magnitude generally possessed by conductive metals. Also, when reference is made to impurities of a "first type" and to impurities of a "second type", it is understood that the "first type" refers to the opposite conductivity type than the "second type". That is, if the "first type" is p, then the "second type" is n. If the "first type" is n, then the "second type" is p.

Also, for convenience, the discussion of fabrication steps refers to photolithography. However, other lithographic techniques, such as electron beam systems, can be employed when desired. Moreover, although the discussion which follows employs the preferred material, polycrystalline silicon, as, for instance, a gate material, other materials can be employed to provide various conductive layers, such as the gates. In particular, such can be fabricated from a refractory metal or silicide thereof. A refractory metal, as will be discussed herein, is understood within the context of the present invention to be a metal which can withstand the high temperatures experienced during the fabrication without degrading to an undesired extent. Examples of some refractory metals include tungsten, tantalum, hafnium, molybdenum, vanadium, niobium, rhodium, and cobalt.

Referring to FIG. 1.1, there is shown a p-type silicon substrate 2 having any desired crystal orientation (e.g. <100>) which can be prepared by slicing and polishing a p-type silicon boule grown in the presence of a p-type dopant, such as boron, following conventional crystal growth techniques. Other p-dopants for silicon include aluminum, gallium, and indium. A typical dosage of the p-type dopants is about $10^{15}$ atoms/cm$^3$. Located on the p-substrate is a n-type impurity sublayer 3 containing an enhanced concentration of n-type dopant impurities, such as phosphorus, arsenic, or antimony usually present in a concentration of about $10^{20}$ atoms/cm$^3$. Located on top of the n+ sublayer 3 is a n-epitaxially grown silicon layer 4 containing n-type impurities, such as phosphorus, arsenic, or antimony. A typical concentration of the n-type impurities is about $10^{16}$ atoms/cm$^3$.

An oxide layer 5, such as silicon oxide, is provided on the n-epitaxial silicon layer by, for instance, thermal oxidation of the silicon layer, or by well-known vacuum or chemical vapor deposition techniques. Typically, the thickness of this layer 5 is about 100 to about 1000 Å.

An adherent oxidation barrier layer 6 or a nonoxidizing material, such as silicon nitride, aluminum nitride, boron nitride, aluminum oxide, or silicon carbide is then deposited. Preferably, the layer 6 is a nitride such as silicon nitride and is approximately 500 to about 3000 Å thick. The layer 6 may be deposited by conventional chemical-vapor deposition techniques. An additional layer of silicon dioxide 7 is then deposited. The silicon dioxide layer 7 is approximately 100 to about 1000 Å thick and may be formed by chemical-vapor deposition.

The oxidation barrier layer material should not oxidize, or at most only oxidize extremely slowly relative to the oxidation rate of silicon and polycrystalline silicon. The oxidation barrier layer material is considered to be a nonoxidizing material under the conditions to which it is subjected in the method of the present invention.

A pattern-determining layer, such as a layer of resist material (not shown) of the type employed in known lithographic masking and etching techniques is placed over the surface of the upper oxide layer 7. Any of the well-known photosensitive polymerizable resist materials known in the art may be used. The resist material is applied, such as by spinning on or by spraying.

The layer of photoresist material is dried and then selectively exposed to ultraviolet radiation using a photolithographic mask. The mask is of a transparent material having opaque portions in a predetermined pattern. The masked wafer is subject to ultraviolet light which polymerizes the portions of the resist material underlying the transparent regions of the mask. After removing the mask, the wafer is rinsed in a suitable developing solution which washes away the portions of the resist material which were not under the opaque portions of the mask and, thus, exposed to the ultraviolet light.

Next, the structure is treated to remove the portions of the silicon dioxide layers 5 and 7 and the silicon nitride layer 6 not protected by the resist material (see FIG. 1.2). The portions removed of such layers are regions wherein recessed field oxide is to be subsequently formed. The silicon dioxide and silicon nitride layer can be removed by standard wet chemical etching or by reactive ion etching, such as using CF$_4$ plus hydrogen. Also, a portion of the epitaxial silicon is removed by reactive ion etching, such as using CF$_4$ or CCl$_2$CF$_2$ plus oxygen, in those regions wherein recessed field oxide is subsequently formed. Approximately 2000 Å to about 1 micron, and most preferably about one-half micron, of the n-epitaxial silicon layer is removed. The n-epitaxial silicon layer 4 initially is about 0.5 micron to about 2 microns, and preferably about 1 micron.

The photoresist material above the pattern etched is then removed by dissolving in a suitable solvent. Next, a layer of silicon dioxide 8 is thermally grown (see FIG.

1.3). Such is approximately 1000 Å to about 1 micron thick, and preferably about 2000 Å. It can be grown by thermal oxidation of the assembly at about 1000° C. in the presence of dry oxygen. If desired, this oxide layer can be provided by a combination of thermally grown silicon dioxide and chemical vapor deposited dioxide.

Next, the silicon dioxide layer is removed by reactive ion etching employing, for instance, a gaseous fluorocarbon, such as $CF_4$ and $H_2$ supplying gas in order to provide selective etching of the silicon dioxide as opposed to etching of the silicon beneath the oxide layer. A discussion of such reactive etching can be found in Ephrath, "Selective Etching of Silicon Dioxide Using Reactive Ion Etching with $CF_4$-$H_2$", *Journal of the Electrochemical Society*, Vol. 128, No. 8, Aug. 1979, pages 1419 and 1421, and U.S. Pat. application Ser. No. 67,261 to Ephrath, disclosures of which are incorporated herein by reference.

The reactive ion etching removes all of the exposed silicon dioxide layer except for that silicon dioxide on the side wall on the silicon as shown in FIG. 1.3. A discussion of using reactive ion etching to remove silicon dioxide everywhere except on vertical sidewalls can be found in U.S. Pat. No. 4,234,362 to Riseman, disclosure of which is incorporated herein by reference.

Next, an n-type dopant is introduced such as by ion-implantation, to provide enhanced doping in the recessed region. An example of an n-type dopant is an arsenic implant of about 100 to about 300 keV energy and about $10^{15}$ atoms/cm$^2$ dose and resulting in a $10^{20}$ atom/cm$^3$ concentration.

A refractory metal is then deposited, such as by sputsputtering or preferably by evaporation. Examples of suitable refractory metals include tungsten, tantalum, niobium, molybdenum, hafnium, cobalt, and vanadium, and preferably tungsten and tantalum. Mixtures can be employed if desired. The electrically conductive compound of the refractory metal 9 is formed by reacting the metal with the substrate (see FIG. 1.4). In the case of silicon, the compound formed is a silicide. The compound or silicide can be formed by either reacting the metal at elevated temperatures, such as at about 700° C. to about 1100° C., or by implanting certain ions through the metal layer, such as inert gas ions, such as argon, krypton, and xenon, or other ions, such as antimony or silicon. Discussions of employing ion implantation to achieve reaction between a refractory metal and an underlying layer of silicon can be found in Tsai et al, "Refractory Metal Silicide Formation Induced by As$^+$ Implantation", *Applied Physics Letters*, 37(3), 1 Aug. 1980, pages 295 to 298; and Chapman et al, "Silicide Formation by High Dose Si$^+$-Ion Implantation of Pd", *Journal of Applied Physics*, 50(10), Oct. 1979, pp. 6321–6327.

During the formation of the silicide, the silicon nitride layer 6 prevents refractory metal located above it from reacting with any silicon. The metal which does not react is then removed by dissolving in a suitable composition. For instance, tantalum can be removed by employing a KOH solution.

The thickness of the metal layer is usually about 500 Å to about 2000 Å.

Recess oxide 10 (see FIG. 1.5) is next formed by thermal oxidation at about 800° to about 1000° C. in dry oxygen. During oxidation, silicon diffuses upward through the silicide layer to form the oxide. Next, the oxidation mask, silicon nitride 6, is removed by employing a suitable etchant which does not attack the oxide present or other components of the already formed device. For instance, silicon nitride can be removed by phosphoric acid solution at about 180° C. It is noted that instead of thermal oxidation, the recessed oxide layer can be formed by depositing, such as by chemical vapor deposition, a layer of silicon oxide and then planarizing the surface with a photoresist and then etching back by use of reactive ion etching, such as in $CF_4$ or mixture of $CF_4$ and $H_2$ as discussed hereinabove.

The fabrication steps which follow are merely presented as illustrative of the many different types of procedures that can be employed to form the desired bipolar transistor and circuit.

For instance, deep dielectric or deep trench isolation is next formed. One convenient way to do such is to deposit a layer of polysilicon 11 (see FIG. 1.6). The polysilicon layer is approximately 1500 to about 5000 Å thick and may be formed by chemical vapor deposition. Next, a silicon dioxide layer 12 is formed over the polysilicon layer 11. The silicon dioxide layer 12 is about 1500 to about 5000 Å thick and can be formed by chemical vapor deposition. The polysilicon layer 11 serves as a reactive ion etching stop when silicon dioxide is to be etched. A photoresist mask (not shown) is applied to the assembly and preselected portions thereof are removed by use of a photolithographic mask. Those portions not protected by the photoresist are removed by reactive ion etching. The silicon dioxide is etched by reactive ion etching employing $CF_4$ and $H_2$, as discussed hereinabove. The polysilicon and silicon are etched by employing $Cl_2$ plus Ar, $CF_4$, or $CCl_2F_2$ plus $O_2$ After all of the photoresist is removed, the trenches 13 in the silicon are removed by selective reactive ion etching in $Cl_2$ plus Ar or $CCl_2F_2$ plus $O_2$. Next, channel stops are formed in the bottoms of the trench by ion implantation of a p-type dopant.

A thin layer of silicon dioxide (not shown) of about 200 to about 1000 Å thick is grown on the exposed silicon surface. Next, silicon dioxide 14 (see FIG. 1.7) is chemically vapor deposited to fill up the trenches. The surface is then planarized using a photoresist and etching process. All of the photoresist can be removed by reactive ion etching in $CF_4$. The silicon oxide on top of the polysilicon is removed by reactive ion etching in $CF_4$ and hydrogen as discussed hereinabove. The polysilicon layer is removed, for instance, by etching in a solution of pyrocatechol. Next, the silicon oxide layer is removed from those areas on top of the active device regions.

The deep trench isolation process is thus complete and the refractory metal silicide layer 9 is in place. The usual process steps can be followed to fabricate the desired bipolar device and circuit. The following fabrication steps are merely presented as illustrative of the procedure that can be employed to form an npn bipolar transistor having its emitter self-aligned to its polysilicon base contact. A discussion of such self-alignment bipolar transistors can be found in U.S. Pat. No. 4,157,269 to Ning and Yu, and in Ning et al, "Self-Aligned NPN Bipolar Transistors", 1980, International Electron Devices Meeting Technical Digest, pp. 823–824.

A layer 15 of polycrystalline silicon is then deposited (see FIG. 1.8). The polycrystalline silicon is approximately 1500 to 5000 Å thick, and may be formed by chemical-vapor deposition. Layer 16 of silicon dioxide is then deposited. The silicon dioxide layer 16 is approximately 2000 to 5000 Å thick and may be formed by chemical vapor deposition. A pattern determining layer (not shown), such as a layer of resist material of the type employed in known lithographic masking and etching techniques, is placed over the entire surface of the upper oxide 16. Any of the well-known polymerizable resist materials known in the art may be used. The resist material is applied, such as by spinning on or by spraying. The layer of photoresist material is dried and then selectively exposed to ultraviolet radiation using a photolithographic mask. With the patterned photoresist as mask, the silicon dioxide 16 is reactive ion etched in $CF_4$ and $H_2$, and the polysilicon layer 15 is partially reactive ion etched in $CF_4$. Etching of the polysilicon layer 15 is then completed by using a solution of $HF:HNO_3:CH_3COOH=1:3:8$ which preferentially etches heavily doped silicon but does not etch the lightly doped n-type silicon layer 4.

The photoresist material is then removed. A thin silicon dioxide layer is then formed on the exposed silicon and polysilicon surfaces by thermal oxidation. This layer is approximately 100 to about 1000 Å thick. Another layer of silicon dioxide approximately 1000 to about 3000 Å thick is then put down by chemical vapor deposition. This combined layer of thermal silicon dioxide and chemical-vapor deposited silicon dioxide is then reactive ion etched in $CF_4$ and $H_2$, removing it everywhere except on the sidewalls of polysilicon layer 15. Thus, the polysilicon layer is insulated on the top by silicon dioxide 16 and on the vertical sides by silicon dioxide 19 (see FIG. 1.9).

N-type impurities, such as arsenic, are now introduced by ion implantation or thermal diffusion to form the emitter. P-type impurities, such as boron, are then introduced by ion implantation to form the intrinsic base region. The polysilicon layer 15 and the silicon dioxide 19 together act as the mask in the emitter and intrinsic base formation process. Thus, the emitter region is self-aligned to the polysilicon 15 which contacts the base region.

In fabricating any integrated circuit, it is necessary to connect high-electrical conductivity lines to the various active elements of the device. The electrical connections are fabricated by applying a photoresist layer (not shown) to the assembly. The resist is exposed to ultraviolet radiation using a lithographic masking pattern, and the exposed regions of the resist are dissolved away. Next, the structure is treated to remove the portions of the silicon dioxide not protected by the resist material. For instance, the wafer is immersed in a solution of buffered hydrofluoric acid to provide contact holes or vias through the oxide layer to allow electrical connection to be made. The remaining photoresist above the etched silicon dioxide is then removed by dissolving a suitable solvent.

Next, the metallic type higher electrical conductivity interconnection line material 20, preferably a metal, is deposited and the interconnection pattern is delineated. An example of a highly conductive material commonly used for interconnection is aluminum. The high-electrical conductivity material, such as aluminum, may be deposited by sputtering or, preferably, by evaporation.

Next, a photoresist layer (not shown) is applied to the assembly. The resist material is exposed with ultraviolet radiation using a predetermined mask pattern. Then the structure is treated to remove portions of the conductive material not protected by the resist. Finally, the resist material over the pattern conductive material is removed by dissolving in suitable solvent.

Reference to FIG. 2.1 illustrates a partially fabricated MOSFET which is achieved by the same sequence steps as is the structure shown in FIG. 1.5, except that the starting substrate is a p-epitaxially grown silicon substrate 21 on an n+ silicon wafer 22 and the implantation is p-type whereas the process discussed with respect to FIG. 1 employs n-type.

Subsequent to this, a device along the lines of FIG. 2.2 can be prepared by employing conventional or known processing techniques. In FIG. 2.2, numeral 23 represents n+ source and/or drain regions, 24 represents silicon dioxide isolation areas, 25, 26 and 27 represent polycrystalline silicon gates, and 28 represents metallic interconnections. In addition, gates 26 and 27 can be formed by self-aligning technique as described in U.S. Pat. application Ser. No. 86,608 to Ning et al, incorporated herein by reference.

What is claimed is:

1. An integrated circuit containing a semiconductive substrate having field isolation regions and electrical conductive regions of active impurity dopants wherein the improvement comprises a refractory metallic silicide entirely located beneath field isolation regions and having its entire lower surface in direct electrical contact with electrical conductive regions of active impurity dopants.

2. The integrated circuit of claim 1 wherein said refractory metallic silicide is selected from the group of tungsten, tantalum, niobium, molybdenum, hafnium, cobalt, vanadium, or mixtures thereof.

3. The integrated circuit of claim 1 wherein said metallic silicide is selected from the group of silicides of tungsten, tantalum, or mixtures thereof.

4. The integrated circuit of claim 1 wherein said silicide is tungsten silicide.

5. The integrated circuit of claim 1 wherein said silicide is tantalum silicide.

6. The integrated circuit of claim 1 wherein said field isolation is silicon dioxide.

7. The integrated circuit of claim 1 which is a bipolar device.

8. The integrated circuit of claim 1 which is a MOS device.

* * * * *